United States Patent
Wang et al.

(10) Patent No.: US 9,390,099 B1
(45) Date of Patent: Jul. 12, 2016

(54) METHOD AND APPARATUS FOR IMPROVING A COMPRESSION RATIO OF MULTIPLE DOCUMENTS BY USING TEMPLATES

(75) Inventors: Chen Wang, Shanghai (CN);
Zhongqiang Wu, Shanghai (CN);
Rossen Dimitrov, Nashua, NH (US)

(73) Assignee: EMC Corporation, Hopkinton, MA (US)

( * ) Notice: Subject to any disclaimer, the term of this patent is extended or adjusted under 35 U.S.C. 154(b) by 980 days.

(21) Appl. No.: 13/074,559

(22) Filed: Mar. 29, 2011

(51) Int. Cl.
*G06F 17/30* (2006.01)
*H03M 7/30* (2006.01)

(52) U.S. Cl.
CPC ....... *G06F 17/30153* (2013.01); *H03M 7/3059* (2013.01)

(58) Field of Classification Search
None
See application file for complete search history.

(56) References Cited

U.S. PATENT DOCUMENTS

| | | | |
|---|---|---|---|
| 2002/0065822 A1* | 5/2002 | Itani | 707/7 |
| 2009/0198761 A1* | 8/2009 | Nanda | H03M 7/30 709/201 |
| 2010/0125641 A1* | 5/2010 | Shelby | 709/206 |

* cited by examiner

*Primary Examiner* — Miranda Huang
(74) *Attorney, Agent, or Firm* — Krishnendu Gupta; Gerald P. Kazanjian

(57) ABSTRACT

Example embodiments of the present invention effectively manage a large set of records such that each can be quickly accessed while still reducing the system capacity used for storing the records by taking into account specifics of the record structure. A template document is constructed for a large set of similar documents, such that it represents the maximum common portion of content in the document set. The template is compressed and stored. Every document in the set is then concatenated individually to the uncompressed template and the concatenated result is compressed. The compressed template is then subtracted from the combined compressed result. The result of this subtraction is stored in the data store for each document. Effectively, only the compressed difference between each document and the template is stored, which reduces significantly the amount of capacity necessary for storing the document set (e.g., by a factor of 5 or 10).

20 Claims, 3 Drawing Sheets

METHOD AND APPARATUS FOR IMPROVING A COMPRESSION RATIO OF MULTIPLE DOCUMENTS BY USING TEMPLATES

A portion of the disclosure of this patent document may contain command formats and other computer language listings, all of which are subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This application relates to data compression.

BACKGROUND

Data compression is the process of encoding information using fewer bits than the original representation would use. Compression is useful because it helps reduce the consumption of expensive resources, such as hard disk space or transmission bandwidth. In certain compression schemes, multiple files are compressed together into a single compressed file.

SUMMARY

Example embodiments of the present invention effectively manage a large set of objects such that each can be quickly accessed while still reducing the system capacity used for storing the objects by taking into account specifics of the object structure. A template document is constructed for a large set of similar objects, such that it represents the maximum common portion of content in the object set. The template is compressed and stored. Every object in the set is then concatenated individually to the uncompressed template and the concatenated result is compressed. The compressed template is then subtracted from the combined compressed result. Effectively, only the compressed difference between each object and the template remains, which reduces significantly the amount of capacity necessary for storing the object set (e.g., by a factor of 5 or 10).

BRIEF DESCRIPTION OF THE DRAWINGS

The above and further advantages of the present invention may be better under stood by referring to the following description taken into conjunction with the accompanying drawings in which.

DETAILED DESCRIPTION

Figure 1:
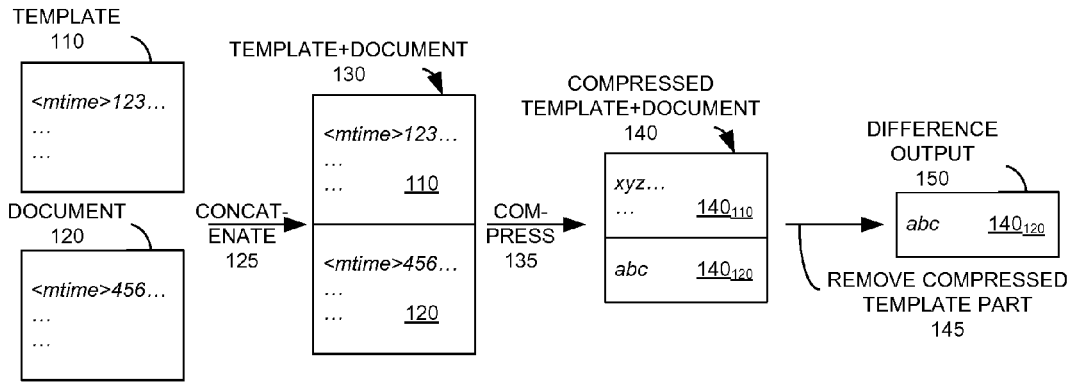
FIG. 1 is a block diagram illustrating states during Template Based Compression (TBC) compression according to an example embodiment of the present invention.

Compressed data must be decompressed to be used, and this extra processing may be detrimental to some applications. The design of data compression schemes therefore involves trade-offs among various factors, including the degree of compression, the amount of distortion introduced (i.e., if using a lossy compression scheme), the computational resources required to compress and uncompress the data and the general availability of each individual data object (i.e., if multiple data objects are compressed together).

Example embodiments of the present invention presents a data reduction scheme based on Template Based Compression (TBC). This method is applicable in environments where the data set comprises a large number of independent documents whose content does not differ significantly and addresses a limitation of other compression schemes that would concatenate all individual documents and compress the aggregate content. Such traditional approaches are not adequate in systems where high-performance random access to the individual documents is required. Additionally, such systems cannot afford to compress a large number of metadata records together because it makes extraction of a particular metadata record from the compressed records a costly transaction.

An example environment in which example embodiments of the present invention would be beneficial is Atmos® by EMC Corporation of Hopkinton, Mass. Atmos® is a large-scale object store capable of managing billions of individual objects. Data objects in Atmos® have metadata records and object data. The metadata record may be XML metadata records representing the user content in the Atmos® system. These XML metadata records have similar structure, which follows an XML Schema in which the XML element and attribute tags in all documents are the same. Additionally, most of the element and attribute values are the same as well. In general, the difference between two XML metadata documents is usually in the order of ten percent to twenty percent. However, such metadata for the storage system is considered overhead from the perspective of a user of the storage system.

Example embodiments of the present invention address how to effectively manage a large set of metadata records such that each can be quickly accessed while still reducing the system capacity used for storing the metadata by using compression/data reduction techniques that take into account specifics of the metadata structure.

In example embodiments of the present invention, a template document is constructed for a large set of similar documents, such that it represents the maximum common portion of content in the document set. The template is compressed and stored. Every document in the store is then concatenated individually to the uncompressed template and the concatenated result is compressed. The compressed template is then subtracted from the combined compressed result. The result of this subtraction is stored in the data store for each document in the set of documents. Effectively, only the compressed difference between each document and the template is stored, which reduces significantly the amount of capacity necessary for storing the document set (e.g., by a factor of 5 or 10).

Additionally, the template based compression technique is compatible with algorithms that belong to a family of dictionary-based compression (i.e., dictionary coder). These algorithms encode variable length strings of symbols as tokens, such that (1) the tokens form an index into a phrase dictionary and (2) the tokens are smaller than the phrases they replaced.

The majority of modern compression tools, even dictionary based ones, usually use entropy coding in order to further reduce the size of the compressed output. However, entropy coding causes the compression output to change significantly when data is appended to the input before the compression. In other words, if the input passed to entropy coding-based algorithm changes a little, the compressed results could be completely different.

For example, the popular UNIX compression tool gzip uses both LZ77 and Huffman coding to compress. The output of the first compression phase (i.e., LZ77) is fed into the second phase (i.e., Huffman coding—a type of entropy coding) to further reduce the compressed data size. Such hybrid algorithms are not applicable to TBC because they are incompatible with the use of the template. However, the fastlz compression algorithm, which is a pure dictionary-based compression algorithm, does not suffer from such restrictions.

Template Based Compression (TBC) leverages dictionary based compression algorithms with a template document compressed together with an actual document to achieve an improved compression ratio than compressing each individual document alone. Template Based Compression assumes that: (1) the "'template" and each individual "document" are very similar and share a large amount of common strings (e.g., 80%); and (2) compressing the "template" and "document" together means concatenating the "template" and the "document," then compressing the concatenated output "template+document."

Template Based Compression takes advantage of the following properties of dictionary-based compression (e.g., fastlz): (1) the first half of the compressed concatenated "template+document" will be the same as the compressed "template;" and (2) because each "document' shares a large number of common strings with "template," most of the strings in the "document" part will already be encoded as tokens in the compressed "template+document," thus the size in compressed output corresponding to the "document" part will be much smaller than that of compressing the "document" alone. Based on these observations, a "template" is constructed, which captures the majority of the common strings in the set of "documents" to be compressed, such that the "template" is known to both the compress and decompress stages.

FIG. 1 is a block diagram illustrating states during TBC compression according to an example embodiment of the present invention. As illustrated in FIG. 1, a document 120 (i.e., object) and a template 110 are obtained and concatenated (125) into a concatenated "template+document" 130 comprising both the "template" 110 and the "document" 120. The "template" 110 may be a previously known "template" 110 for a set of documents and the "document" 120 may be any "document" 120 from the set of documents. The concatenated "template+document" 130 is then compressed (135) to be transformed into a compressed "template+document" 140 comprising a compressed "template" part $140_{110}$ and a compressed "document" part $140_{120}$. The compressed "template" part $140_{110}$ is then removed (145) from the compressed "template+document" 140. The difference output 150 (i.e., bytestream difference) of removing the compressed "template" part $140_{110}$ from the compressed "template+document" 140 is the compressed "document" part $140_{120}$.

Figure 2:
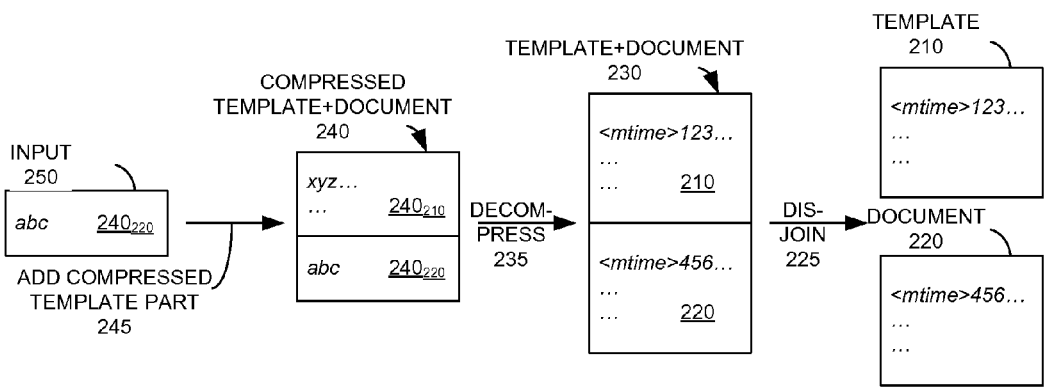
FIG. 2 is a block diagram illustrating states during Template Based Compression (TBC) decompression according to an example embodiment of the present invention.

FIG. 2 is a block diagram illustrating states during TBC decompression according to an example embodiment of the present invention. As illustrated in FIG. 2, decompression works in reverse order of compression, starting with the result of the compression as an input 250 comprising the compressed "document" part $240_{220}$. First, the compressed "template" part $240_{110}$ is added in front of the compressed "document" part $240_{220}$ (245) to restore the compressed "template+document" 240. The compressed "template+document" 240 which comprises the compressed "template" part $240_{110}$ and the compressed "document" part $240_{120}$ is the decompressed (235). This produces the uncompressed concatenated "template+document" 230 comprising both the "template" 210 and the "document" 220. The concatenated "template+document" 230 then is disjoined (225) to remove the previously known "template" 210 from the beginning of the concatenated "template+document" 230. The result is the decompressed "document" 220 which was compressed using TBC as illustrated in FIG. 1.

Figure 3:
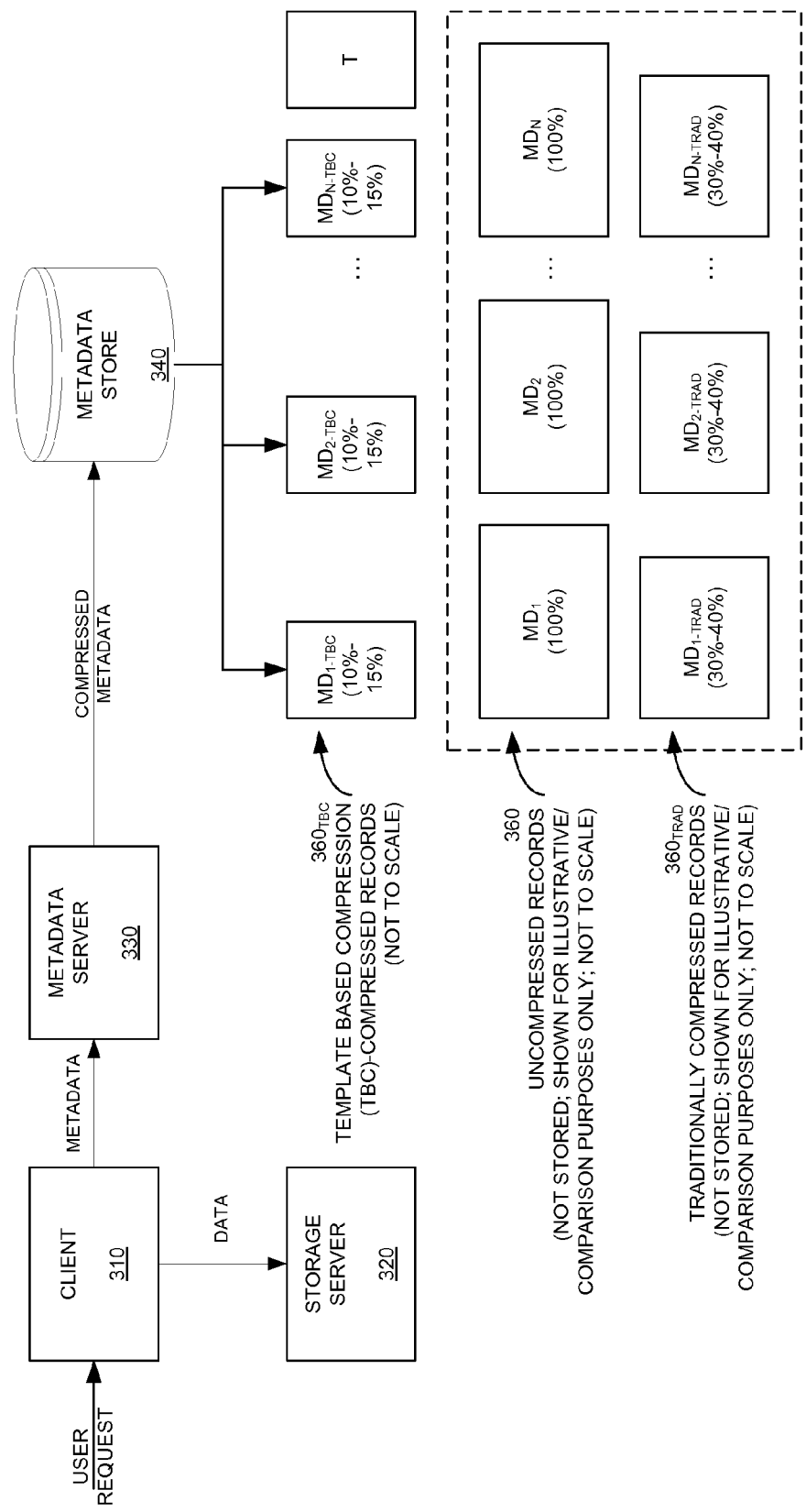
FIG. 3 is a block diagram illustrating the application of Template Based Compression in a storage system.

FIG. 3 is a block diagram illustrating the application of Template Based Compression in a storage system 300, such as Atmos® by EMC Corporation of Hopkinton, Mass., according to an example embodiment of the present invention. The storage system 300 includes a client 310, a storage server 320, a metadata server 330 that stores metadata 350 and a compressed template 355 to a metadata store 340. Template Based Compression is used by the metadata server 330 for metadata records 360 (i.e., $MD_1$-$MD_N$) of objects (not shown) that are managed by the storage system 300 and stored to the storage server 320.

When the metadata records 360 are not compressed, they are stored with their full size (i.e., as indicated by the relative size of the boxes representing the metadata records 360, traditional document-level compressed metadata records $360_{TRAD}$ and TBC compressed metadata records $360_{TBC}$). The size of each uncompressed document 360 is usually in the order of 4 KB to 8 KB. If a traditional document-level compression is used to create traditionally compressed metadata records $360_{TRAD}$, each document (i.e., $MD_{1\text{-}TRAD}$-$MD_{N\text{-}TRAD}$) is compressed separately and the compressed version is written to the metadata store 340. The size of documents with traditional document-level compression $360_{TRAD}$ using typical compression, such LZ77, would be 30%-40% of the original size (i.e., as indicated by the relative size, though not to scale, of the boxes representing the metadata records 360, traditional document-level compressed metadata records $360_{TRAD}$ and TBC compressed metadata records $360_{TBC}$).

However, in example embodiments of the present invention using Template Based Compression (TBC), what is stored on disk in the metadata store 340 are the TBC-compressed metadata records $360_{TBC}$ (i.e., $MD_{1\text{-}TBC}$-$MD_{N\,REC\text{-}TBC}$) along with the compressed template 355 (i.e., T). Using TBC, the size of the documents $360_{TBC}$ in the metadata store 340 is in the order of only 10%-15% of the original size (i.e., as indicated by the relative size of the boxes representing the metadata records 360, traditional document-level compressed metadata records $360_{TRAD}$ and TBC compressed metadata records $360_{TBC}$). Template Based Compression reduces the size on disk in the metadata store 340 significantly without a substantial increase of CPU or memory resources for compression and decompression.

Compression using fastlz builds a dictionary of strings with the objective to replace them with tokens. For example, each string in the dictionary is no shorter than 3 bytes in order to ensure that each string replaced by its corresponding token is longer than the token itself, thus reduce the data size and accomplishing the desired compression.

Consider the following example input string for compression:

<atime>2009-12-19T07:52:47Z</atime><mtime>2009-12-19T07:52:47Z</mtime>

Starting from the beginning of the input string, no string longer than 3 bytes appears twice until the string "</atime>" is reached. The initial output is a non-repeated string, which is the substring in the input from its starting point to where data has been encoded (i.e., the substring is "<atime>2009-12-19T07:52:47 Z</"). Before the actual non-compressed string is sent to the output, a flag indicating the non-compressed substring and its length (i.e., 29) is inserted. The output would be:

<non compress flag><hex 29>"<atime>2009-12-19T07: 52:47Z</"

The next string "atime>" can already be found in the dictionary. Its length (i.e., 6) and the distance from the previous appearance of "atime>" (i.e., 28) are encoded in the input. A flag is the appended to the output that indicates that the substring in question is replaced by a token, which also includes the substring length and the distance to its previous occurrence. The output would be:

<non compress flag><hex 29>"<atime>2009-12-19T07: 52:47Z</"<compress flag><hex 6><hex 28>

The compression continues to encode "<m", which could not be found in the dictionary, directly as non-compressed data. The output would be:

<non compress flag><hex 29>"<atime>2009-12-19T07: 52:47Z</"<compress flag><hex 6><hex 28><non compress flag><hex 2>"<m"

Then"time>2009-12-19T07:52:47Z</", which could be found in the input preceding it and is in the dictionary, is output as compressed data. The output would be:

<non compress flag><hex 29>"<atime>2009-12-19T07: 52:47Z</"<compress flag><hex 6><hex 28><non compress flag><hex 2>"<m"<compress flag><hex 27><hex 35>

Finally, the compression finishes with "mtime>", which could also be found in the dictionary. The final output would be:

<non compress flag><hex 29>"<atime>2009-12-19T07: 52:47Z</"<compress flag><hex 6><hex 28><non compress flag><hex 2>"<m"<compress flag><hex 27><hex 35><compress flag><hex 6><hex 28>

It should be noted that the actual representation in binary form of the compressed string is shorter. The above notation uses textual representations, such as "<hex 6>", which in binary form are represented by a single byte.

Decompression using fastlz may accept the above compression string for decompression. It checks the flag and string length (i.e., <non compress flag><hex 29>), determines that the first 29 bytes are not compressed and outputs them directly. The output would be:

<atime>2009-12-19T07:52:47Z</

The decompression then checks the next flag and string length (i.e., <compress flag><hex 6>, determines that the next 6 bytes are compressed, and the string should be found in the decompressed output, 29 bytes previously. The 6 bytes are then copied from there and appended to the output:

<atime>2009-12-19T07:52:47Z</atime>

Append not compressed "<m":

<atime>2009-12-19T07:52:47Z</atime><m

Copy 27 bytes from the previous 35 bytes:

<atime>2009-12-19T07:52:47Z</atime><mtime>2009-12-19T07:52:47Z</

Copy 6 bytes from the previous 28 bytes to arrive at a final output:

<atime>2009-12-19T07:52:47Z</atime><mtime>2009-12-19T07:52:47Z</mtime>

Accordingly, Template Based Compression (TBC) takes into account the presence of the template and document. Keywords in the document are matched to keywords in the template. Thus, TBC adds only to the compressed size of the document as much as it sees a different set of keywords (i.e., the "template+document" is only a little larger than the compressed template, itself). The binary portion equivalent to the compressed template is then subtracted.

Figure 4:
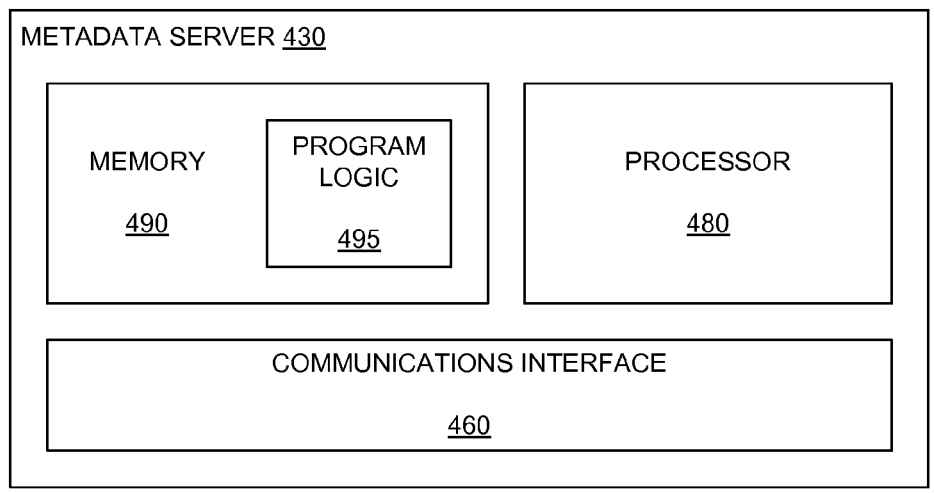
FIG. 4 is a block diagram of an example embodiment apparatus according to the present invention.

FIG. 4 is a block diagram of an example embodiment metadata server 430 according to the present invention. The metadata server 430 includes memory 490 storing program logic 495, a processor 480 and a communications interface 460.

The methods and apparatus of this invention may take the form, at least partially, of program code (i.e., instructions) embodied in tangible non-transitory media, such as floppy diskettes, CD-ROMs, hard drives, random access or read only-memory, or any other machine-readable storage medium. When the program code is loaded into and executed by a machine, such as the metadata server (i.e., computer) of FIG. 4, the machine becomes an apparatus for practicing the invention. When implemented on one or more general-purpose processors, the program code combines with such a processor to provide a unique apparatus that operates analogously to specific logic circuits. As such a general purpose digital machine can be transformed into a special purpose digital machine.

Figure 5:
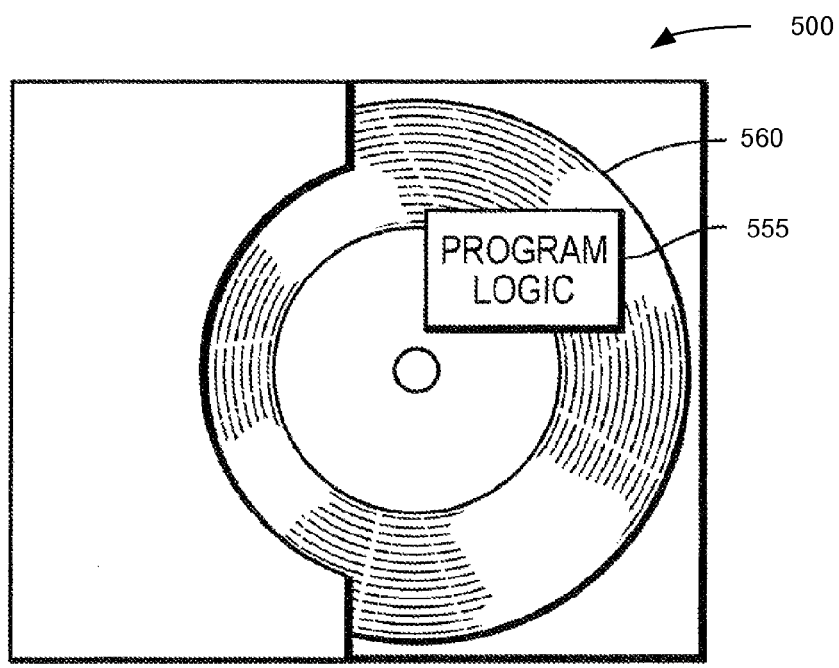
FIG. 5 is an illustration of an example embodiment of the present invention as embodied in program code.

FIG. 5 shows program logic 555 embodied on a computer-readable medium 560 as shown, and wherein the logic is encoded in computer-executable code configured for carrying out the gas controlling process of this invention and thereby forming a computer program product 500.

The logic for carrying out the method may be embodied as part of the aforementioned system, which is useful for carrying out a method described with reference to embodiments shown in, for example, FIGS. 1-3. For purposes of illustrating the present invention, the invention is described as embodied in a specific configuration and using special logical arrangements, but one skilled in the art will appreciate that the device is not limited to the specific configuration but rather only by the claims included with this specification.

Although the foregoing invention has been described in some detail for purposes of clarity of understanding, it will be apparent that certain changes and modifications may be practiced within the scope of the appended claims. Accordingly, the present implementations are to be considered as illustrative and not restrictive, and the invention is not to be limited to the details given herein, but may be modified within the scope and equivalents of the appended claims.

In reading the above description, persons skilled in the art will realize that there are many apparent variations that can be applied to the methods and systems described. In the foregoing specification, the invention has been described with reference to specific exemplary embodiments thereof. It will, however, be evident that various modifications and changes may be made to the specific exemplary embodiments without departing from the broader spirit and scope of the invention as set forth in the appended claims. Accordingly, the specification and drawings are to be regarded in an illustrative rather than a restrictive sense.

What is claimed is:

1. A computer-implemented method comprising:
   concatenating a data object in a set of data objects with a template for the set of data objects;
   compressing the concatenated data object/template pair; and
   determining a difference between the compressed concatenated data object/template pair and a compressed version of the template for the set of data objects.

2. The method of claim 1
   wherein the set of data objects comprises a set of metadata records;
   wherein the template for the set of data objects comprises a metadata template for the set of metadata templates; and wherein compressing the concatenated data object/template pair comprises:
  compressing a metadata record in the set of metadata records; and
  compressing a metadata template for the set of metadata templates.

3. The method of claim 2 wherein the set of metadata records is a set of XML documents.

4. The method of claim 1 wherein the data object is constructed from the template.

5. The method of claim 4 wherein compressing the concatenated data object/template pair comprises matching keywords in the data object to keywords in the template.

6. The method of claim 1 wherein determining a difference between the compressed concatenated data object/template pair and a compressed version of the template for the set of data objects comprises removing a binary portion of the compressed concatenated data object/template pair that is equivalent to the compressed version of the template.

7. The method of claim 1 further comprising:
  concatenating the compressed version of the template for the set of data objects and the difference between the compressed concatenated data object/template pair and the compressed version of the template for the set of data objects;
  decompressing the concatenated compressed template/difference pair; and
  disjoining the template for the set of data objects from the decompressed concatenated compressed template/difference pair.

8. The method of claim 1 further comprising mapping the difference between the compressed concatenated data object/template pair and the compressed version of the template for the set of data objects to the template for the set of data objects to decompress the data object.

9. A system comprising:
  a data store; and
  a computer including memory storing computer-executable logic that, when executed by the computer, causes the computer to perform the operations of:
    concatenating a data object in a set of data objects with a template for the set of data objects;
    compressing the concatenated data object/template pair; and
    determining a difference between the compressed concatenated data object/template pair and a compressed version of the template for the set of data objects.

10. The system of claim 9
wherein the set of data objects comprises a set of metadata records;
wherein the template for the set of data objects comprises a metadata template for the set of metadata templates; and
wherein compressing the concatenated data object/template pair comprises:
  compressing a metadata record in the set of metadata records in the data store, and
  compressing a metadata template for the set of metadata templates.

11. The system of claim 10 wherein the set of metadata records in the data store is a set of XML documents in the data store.

12. The system of claim 9 wherein the data object is constructed from the template.

13. The system of claim 12 wherein compressing the concatenated data object/template pair comprises matching keywords in the object to keywords in the template.

14. The system of claim 9 wherein determining a difference between the compressed the concatenated data object/template pair and a compressed version of the template for the set of data objects comprises removing the binary portion of the compressed the concatenated data object/template pair that is equivalent to the compressed version of the template.

15. The system of claim 9 wherein the memory further stores computer-executable logic that, when executed by the computer, causes the computer to perform the further operations of:
  concatenating the compressed version of the template for the set of data objects and the difference between the compressed the concatenated data object/template pair and the compressed version of the template for the set of data objects;
  decompressing the concatenated compressed template/difference pair; and
  disjoining the template for the set of data objects from the decompressed concatenated compressed template/difference pair.

16. The system of claim 9 wherein the memory further stores computer-executable logic that, when executed by the computer, causes the computer to perform the further operation of mapping the difference between the compressed concatenated data object/template pair and the compressed version of the template for the set of data to the template for the set of data objects to decompress the data object.

17. A computer program product including a non-transitory computer-readable storage medium encoded with computer program code that, when executed on a processor of a computer, causes the computer to perform template based compression, the computer program product comprising:
  computer program code for concatenating a data object in a set of data objects with a template for the set of data objects;
  computer program code for compressing the concatenated data object/template pair; and
  computer program code for determining a difference between the compressed concatenated data object/template pair and a compressed version of the template for the set of data objects.

18. The computer program product of claim 17
wherein the set of data objects comprises a set of metadata records;
wherein the template for the set of data objects comprises a metadata template for the set of metadata templates; and
wherein computer program code for compressing the concatenated data object/template pair comprises:
  computer program code for compressing a metadata record in the set of metadata records; and
  computer program code for compressing a metadata template for the set of metadata templates.

19. The computer program product of claim 18 wherein computer program code for determining a difference between the compressed concatenated data object/template pair and a compressed version of the template for the set of data objects comprises computer program code for removing a binary portion of the compressed concatenated data object/template pair that is equivalent to the compressed version of the template.

20. The computer program product of claim 17 further comprising:
  computer program code for concatenating the compressed version of the template for the set of data objects and the difference between the compressed concatenated data object/template pair and the compressed version of the template for the set of data objects;
computer program code for decompressing the concatenated compressed template/difference pair; and
computer program code for disjoining the template for the set of data objects from the decompressed concatenated compressed template/difference pair.

* * * * *